(12) United States Patent
Hrivnak et al.

(10) Patent No.: US 10,680,582 B1
(45) Date of Patent: *Jun. 9, 2020

(54) SINGLE SOLUTION IMPEDANCE MATCHING METHOD

(71) Applicant: Palstar, Inc., Piqua, OH (US)

(72) Inventors: Paul Hrivnak, Piqua, OH (US); John L. Keith, Gilmer, TX (US)

(73) Assignee: PALSTAR, INC., Piqua, OH (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/663,404

(22) Filed: Oct. 25, 2019

Related U.S. Application Data

(62) Division of application No. 16/443,139, filed on Jun. 17, 2019, now Pat. No. 10,483,946.

(60) Provisional application No. 62/839,043, filed on Apr. 26, 2019.

(51) Int. Cl.
*H04B 1/02* (2006.01)
*H03H 11/30* (2006.01)
*H04B 1/04* (2006.01)

(52) U.S. Cl.
CPC .............. *H03H 11/30* (2013.01); *H04B 1/04* (2013.01)

(58) Field of Classification Search
CPC ...... H04B 1/0458; H04B 1/04; H03H 7/1775; H03H 7/38; H03H 7/42; H03H 7/468; H03H 9/0004
See application file for complete search history.

(56) References Cited

U.S. PATENT DOCUMENTS

| 1,038,931 | A | 8/1919 | Silva-Martinez | ....... H03F 68 02 |
| 4,486,722 | A * | 12/1984 | Landt | ....... H03H 7/40 |
| | | | | 327/503 |
| 4,965,607 | A | 10/1990 | Wilkins | ........... 343/861 |
| 7,724,484 | B2 | 5/2010 | Bahl | ................... 361/56 |
| 10,389,316 | B1 * | 8/2019 | Silva-Martinez | .......................... |
| | | | | H03F 3/45188 |
| 10,483,946 | B1 | 11/2019 | Hrivnak et al. | |
| 2008/0106349 | A1 | 5/2008 | Mckinzie et al. | ........... 333/17.3 |
| 2012/0051409 | A1 | 3/2012 | Brobston et al. | ............. 375/222 |

(Continued)

OTHER PUBLICATIONS

SEA 1612C/121612WX/1617WX, Automatic Antenna Tuner, Instruction and Maintenance Manual, 22 pages, Aug. 1, 2009.

(Continued)

*Primary Examiner* — Tuan Pham
(74) *Attorney, Agent, or Firm* — Slayden Grubert Beard PLLC

(57) ABSTRACT

An RF source impedance is raised with an impedance step-up transformer and a matching circuit is coupled between the stepped up impedance RF source and a RF load wherein the RF load impedance can be matched to the stepped up RF source impedance with a matching network comprising a variable capacitor and a variable inductor having single match solutions for all frequencies and impedances so long as the RF load impedance is less that the stepped up RF source impedance. A RF attenuator may be used to provide a better impedance load to the RF source during match determination and adjustment of the variable capacitor and variable inductor. Automatic impedance matching measures the RF source frequency and RF load voltage, current and phase to determine a single match solution for a capacitive value of the variable capacitor and an inductive value for the variable inductor.

16 Claims, 14 Drawing Sheets

(56) References Cited

U.S. PATENT DOCUMENTS

2018/0342798 A1\* 11/2018 Lin .......................... H01Q 1/22
2019/0238164 A1 8/2019 Takenaka et al.

OTHER PUBLICATIONS

SGC SG-230 Smarttuner Microprocessor Controlled Automatic Antenna Coupler, Installation and Operations Manual, 81 pages, Nov. 1, 2000.
SEA 1612C/1612W/1612WX, Automatic Antenna Tuner, Instruction and Maintenance Manual, 43 pages, Jul. 1, 2001.
ICOM Service Manual HF+MHz Automatic Antenna Turner AH-4, 23 pages, 1998.
Instruction Manual for MFJ IntelliTuner Automatic Antenna Tuner, Model MFJ-994B, 48 pages, 2012.
Instruction Manual for MFJ Legal Limit IntelliTuner Remote Automatic Antenna Tuner, Model MFJ-998RT, 28 pages, 2011.
U.S. Non-Final Office Action, U.S. Appl. No. 16/521,911, 16 pages, dated Mar. 18, 2020.

\* cited by examiner

L-Matching network.

$$+j\omega L = \sqrt{(R_{LO})(R_{HI}) - (R_{LO})^2} \tag{1.1}$$

$$-j\omega C = [(R_{LO})(R_{HI})/+j\omega L]^{-1} \tag{1.2}$$

$$i_L(rms) = \sqrt{P/R_{LO}} \tag{1.3}$$

$$v_L(pk) = +j\omega L\sqrt{2P/R_{LO}} \tag{1.4}$$

$$v_C(pk) = \sqrt{2PR_{HI}} \tag{1.5}$$

$$i_C(rms) = \frac{\sqrt{PR_{HI}}}{-j\omega C} \tag{1.6}$$

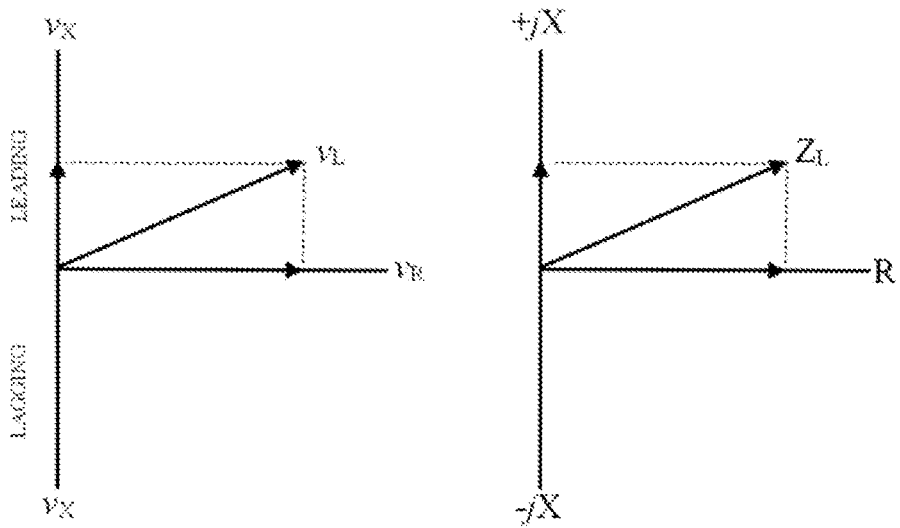

(a) Vector plots representing the measured voltage and current and the resultant impedance calculations result.

(b) Equations to calculate Load Impedance and convert to equivalent R and X.

$$Z_L = \frac{v_L}{i_L} \qquad R = (\cos \Theta)(Z_L) \qquad X = (\sin \Theta)(Z_L) \angle \Theta$$

Example Calculations:

$v_L = 30V$ (measured)   $i_L = 1.5A$ (measured)   $\Theta = 30°$ (measured)

$$Z_L = \frac{30V \angle 30°}{1.5A} \quad \text{so, } Z_L = 20 \angle 30° \, \Omega$$

$R = (\cos 30°)(20\Omega)$ so, $R = 17.3\Omega$ $X = (\sin 30°)(20\Omega)$ so, $R = 10 \angle 90° \, \Omega$ which, when written in polar form is $17.3 + j10\Omega$

SINGLE SOLUTION IMPEDANCE MATCHING METHOD

RELATED PATENT APPLICATIONS

This application is a divisional application of and claims priority to commonly owned U.S. patent application Ser. No. 16/443,139; filed Jun. 17, 2019; which claims priority to Provisional Patent Application No. 62/839,043; filed Apr. 26, 2019; both are hereby incorporated by reference herein for all purposes.

TECHNICAL FIELD

The present disclosure relates to impedance matching, and, in particular, to matching a radio frequency load having a second impedance to a radio frequency source having a first impedance wherein there is only one match solution for each frequency of operation.

BACKGROUND

Maximum power transfer occurs when an alternating current (AC) generator output impedance matches a load impedance. For radio frequency (RF) applications this is especially important as RF generating devices are most efficient when operating at their design impedance. A subset of RF generating devices may be, for example but are not limited to, RF transmitters and power amplifiers, and a subset of RF loads may be antennas used for transmitting RF. Generally, RF transmitters operating in the high frequency (HF), very-high frequency (VHF), ultra-high frequency (UHF), and microwave bands require a well-defined load impedance, e.g., 50-ohm or 75-ohm, to efficiently operate into for maximum RF power transfer. However, most antennas are not 50 or 75 ohms except at some specific frequency when carefully designed and adjusted to that frequency and load impedance. Therefore, to match the load impedance of a transmitting antenna to the output impedance of a RF transmitter an antenna matching network or "antenna coupler" may be used between the transmitter and antenna when the transmitter and antenna must operate at a number of different frequencies.

Typically, an inductor-capacitor (L-C) matching network is required which may be configured as a T-network (FIG. 1), also known as a high pass filter, or an L-network (FIG. 2) which may be configured as a low pass filter. Another configuration of the L-network is the π-network (FIG. 3) which has a first capacitor on the source side and a second capacitor on the load side.

The T-network has the following issues: a) there may be multiple L-C matching solution combinations which may have significant component stresses due to high RF currents and/or voltages, b) a "correct" (best) matching solution may be difficult to find, and c) the T-network requires more components to provide the correct matching solutions. The L-network may require unusually large values of inductance and/or capacitance, and the π-network, like the T-network, requires more components to provide the correct matching solutions.

SUMMARY

Hence, there is a need for an impedance matching system, method and apparatus to maximize power transfer between a source and load that does not suffer from the limitations of having multiple matching solutions, significant component stresses due to high currents and/or voltages, and may require more than two adjustments to achieve an impedance match solution.

According to an embodiment, a method for matching an impedance of a radio frequency (RF) load to an impedance of a RF source may comprise the steps of: a) providing a matching network may comprise a variable capacitor and a variable inductor; b) providing a 1:N step-up impedance transformer having an output coupled to the matching network; c) coupling a RF attenuator; and frequency, voltage, current and phase detectors between an RF source and an RF load; d) measuring the RF source frequency, and the RF load voltage, current and phase; e) determining inductance and capacitance values of the matching network required to match the RF load impedance to the RF source impedance using the measured frequency, voltage, current and phase; f) setting the variable inductor to the determined inductance value and the variable capacitor to the determined capacitance value; g) coupling the RF source to the input of the 1:N step-up impedance transformer and the RF load to the matching network, wherein the RF source has a first impedance that may be stepped up to a second impedance at the output of the 1:N step-up impedance transformer, the second impedance may be N times the first impedance, and the second impedance may be greater than the RF load impedance; and h) decoupling the RF attenuator previously coupled between the RF source and the RF load.

According to a further embodiment of the method, the step of decoupling the frequency, voltage, current and phase detectors previously coupled between the RF source and the RF load when the RF attenuator may be decoupled in step h). According to a further embodiment of the method, N may be 9, the first impedance may be 50 ohms and the second impedance may be 450 ohms. According to a further embodiment of the method, N may be selected from the group consisting of 4, 9 and 12. According to a further embodiment of the method, the RF source may be a RF transmitter and the RF load may be an antenna. According to a further embodiment of the method, the matching network may be configured as a low pass filter whereby the variable capacitor may be coupled at the output of the 1:N step-up impedance transformer and the variable inductor may be coupled between the output of the 1:N step-up impedance transformer and the RF load.

According to a further embodiment of the method, the matching network may be configured as a high pass filter whereby the variable inductor may be coupled at the output of the 1:N step-up impedance transformer and the variable capacitor may be coupled between the output of the 1:N step-up impedance transformer and the RF load. According to a further embodiment of the method, may comprise the steps of monitoring the voltage standing wave ratio (VSWR) at the RF source and if the VSWR exceeds a certain value then go to step a) and thereafter decouple the 1:N step-up transformer, variable inductor and capacitor of steps e) through g) and repeat steps b) through h). According to a further embodiment of the method, the certain value may be 2:1. According to a further embodiment of the method, the variable inductor may comprise a roller inductor. According to a further embodiment of the method, the variable inductor may comprise a plurality of inductors having an inductance configured with a first plurality of switches that short out unused ones of the plurality of inductors, and the variable capacitor may comprise a plurality of capacitors having a capacitance configured with a second plurality of switches that disconnect unused ones of the plurality of capacitors.

According to a further embodiment of the method, the plurality of first and second switches are a plurality of first and second relay contacts. According to a further embodiment of the method, the plurality of first and second switches are a plurality of first and second solid-state switches. According to a further embodiment of the method, the first and second solid-state switches are PIN diode switches. According to a further embodiment of the method, may comprise the step of increasing the RF load impedance with a step-up impedance transformer coupled between the RF load and the matching network. According to a further embodiment of the method, may comprise the step of decreasing the RF load impedance with a step-down impedance transformer coupled between the RF load and the matching network.

BRIEF DESCRIPTION OF THE DRAWINGS

A more complete understanding of the present disclosure may be acquired by referring to the following description taken in conjunction with the accompanying drawings wherein:

FIG. 13 illustrates: (a) vector diagram plots of measured voltage and current, and the resultant calculated impedance of the RF load, and (b) example equations to calculate load impedance and convert to equivalent resistance (R) and reactance (X) values, according to the teachings of this disclosure.

Figure 1:
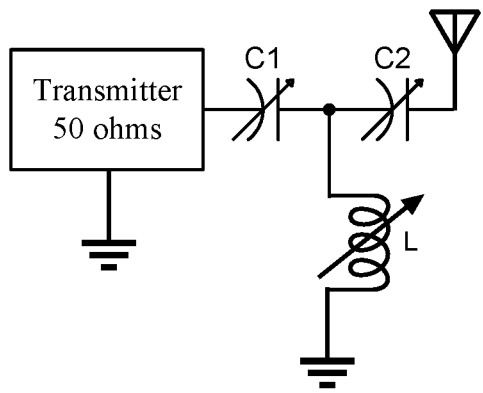
FIGS. 1-3 illustrate prior art schematic diagrams of antenna couplers.
Figure 2:
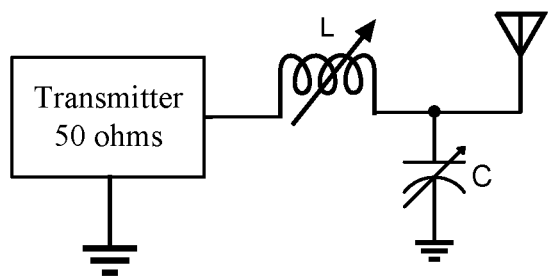
Figure 3:
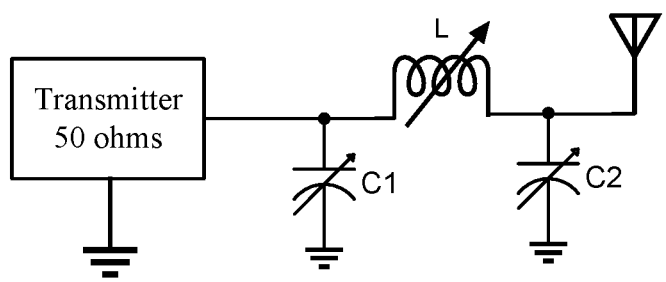

While the present disclosure is susceptible to various modifications and alternative forms, specific example embodiments thereof have been shown in the drawings and are herein described in detail. It should be understood, however, that the description herein of specific example embodiments is not intended to limit the disclosure to the forms disclosed herein.

DETAILED DESCRIPTION

The descriptions of specific example embodiments of the invention herein may refer to a transmitter as the RF source and an antenna as the RF load, and the impedance matching device between the RF source and RF load as an antenna matching network or "antenna coupler." Other types of RF sources such as for example, but not limitation to, are RF power generators used for medical, industrial and military purposes such as nuclear magnetic resonance spectroscopy, diathermy, induction heating, radar, radio controlled drone deactivation, laser excitation, absorption heating, microwave ovens, and the like. RF loads may be in any form that accepts RF power from the RF source and converts the RF power into a useful physical property appropriate for the intended purpose. The RF source may be a frequency agile RF generator, and the RF load may present different complex impedances at various frequencies of use.

Switches referenced to and disclosed herein may be relay controlled switch contacts, rotary switch contacts, and/or solid-state switches such, for example but not limited to, PIN diodes, field effect transistors (FETs), monolithic analog switches and the like.

According to various embodiments, the antenna coupler input may be raised to an impedance higher than the RF load (antenna) to be matched. In order to use an L-match network, the load impedance must be lower than the source impedance. Otherwise, it must be first determined at which end of the inductor (source or load side) the capacitor needs to be connected. To avoid this complication, the antenna coupler operates at a higher input impedance than the output load impedance to be matched, for example but is not limited to, a 450-ohm input matching network. This has the additional benefit of making the inductor and capacitor values more feasible.

Raising the input impedance of the antenna coupler may be accomplished with a 1:N step-up impedance transformer e.g., Unun (unbalanced-to-unbalanced) or a Balun (balanced to unbalanced—reversed). Using such a transformer does not add a frequency dependent variable, so simple equations may be used for determining the values of inductance and capacitance, wherein the only variables are the load impedance (calculated from the load voltage, current and phase angle between the voltage and current) and frequency of operation. Wherein a 50-ohm transmitter output is stepped up by a factor of N, e.g., 1:4, 1:9, 1:12. N may also be a positive non-integer value and is contemplated herein. The Unun or Balun may be an air inductor or insulated wire wrapped around a ferrite core toroid. Either a current (choke) or voltage Unun/Balun. It is contemplated and within the scope of this disclosure that N may be a non-integer value, and that the step-up impedance transformer may be implemented with strip line technologies at microwave frequencies. At microwave frequencies the 1:N step-up impedance transformer may be fabricated using strip line technologies, for example, but not limited to, a printed circuit board, ceramic substrate or integrated circuit die.

By using an antenna coupler input impedance higher than the output impedance to be matched to will provide only one correct matching solution. It also may reduce component stress as there may be lower RF currents and voltages on the inductor (L) and capacitor (C) components. It may also provide faster tuning speed for matching during auto-mode match operation and may lower component losses and provide better efficiency. Automatic link establishment (ALE) operation may be easily accommodated with various embodiments of this disclosure by bypassing the antenna coupler and directly coupling the ALE radio to the antenna for receive channel scanning. Since match determination (frequency measurement, load impedance determination, and inductor and capacitor value selection) are so fast no match solution memories are required when going back to transmit and the antenna coupler is again between the transmitter and antenna.

Once the RF frequency of operation, and RF load voltage, current and phase are determined; simple calculations may be used to select inductance and capacitance values for the L-network to match the load impedance to the source impedance. As used herein "phase" refers to the phase angle between the voltage and current of the RF load. A microprocessor and firmware program may be used for the calculations and may also control relays or servo mechanisms for selecting the inductance and capacitance values.

Referring now to the drawings, the details of example embodiments are schematically illustrated. Like elements in the drawings will be represented by like numbers, and similar elements will be represented by like numbers with a different lower-case letter suffix.

Figure 4A:
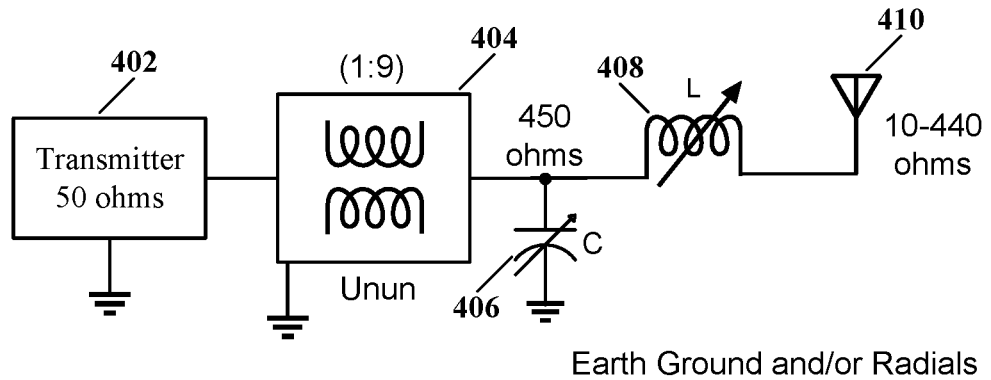
FIGS. 4A and 4B illustrate schematic diagrams of antenna couplers for use with an unbalanced antenna, according to specific example embodiments of this disclosure.
Figure 4B:
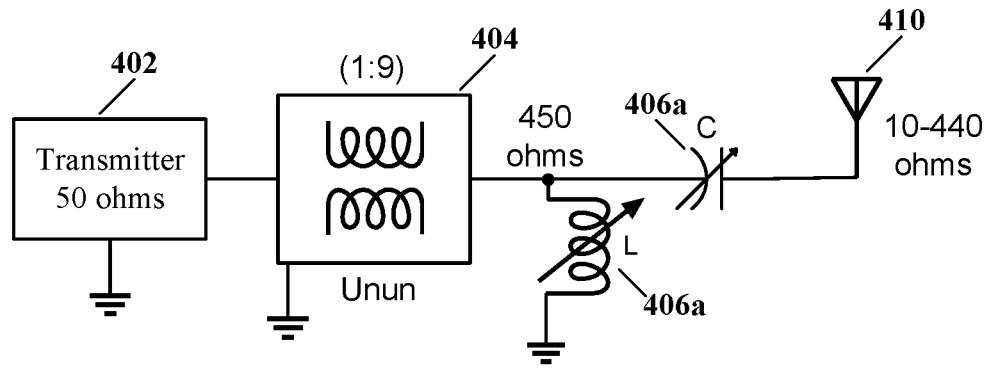

Referring to FIGS. 4A and 4B, depict schematic diagrams of antenna couplers for use with an unbalanced antenna, according to specific example embodiments of this disclosure. A RF source (transmitter) having a 50-ohm output impedance may be stepped up to 450 ohms with a 1:9 impedance step-up transformer 404 (unbalanced-to-unbalanced transformer—Unun). It is contemplated and within the scope of this disclosure that other impedance step-up ratios may be utilized and the 1:9 ratio is used herein for exemplary purposes. This stepped-up impedance (450 ohms) is used as the input impedance of a matching network comprising variable capacitor 406 and variable inductor 408. By using a higher input impedance for the matching network, load impedances of from about 10 ohms to about 440 ohms may be matched using only one set of inductor (L) and capacitor (C) values for a corresponding frequency of operation and load impedance. FIG. 4A illustrated a low pass filter configuration for the matching network, and FIG. 4B illustrated a high pass filter configuration for the matching network. High pass and low pass filter configurations may be interchangeably used for all the specific example embodiments of antenna couplers disclosed herein.

Figure 5:
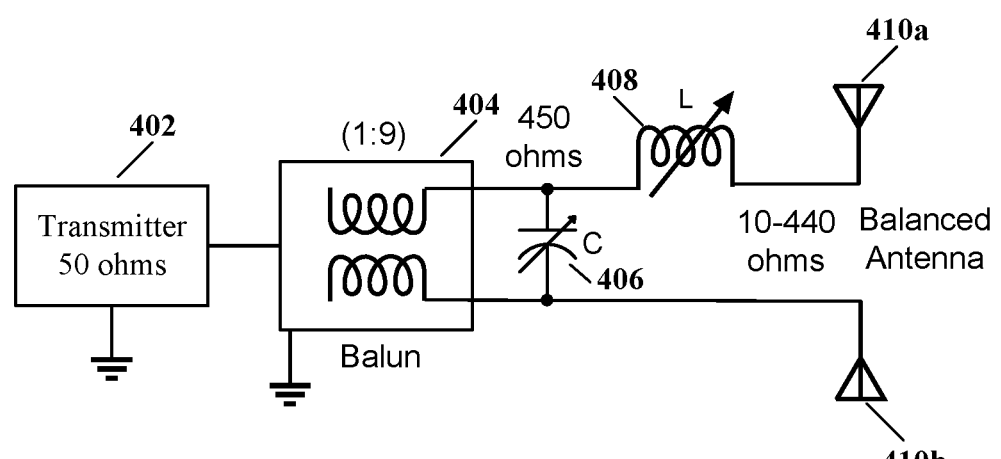
FIG. 5 illustrates a schematic diagram of an antenna coupler for use with a balanced antenna, according to specific example embodiments of this disclosure.

FIG. 5 illustrates a schematic diagram of an antenna coupler for use with a balanced antenna, according to specific example embodiments of this disclosure. The impedance matching circuit shown in FIG. 5 operates in substantially the same way as the matching circuit of FIG. 4 with the difference that an unbalanced-to-balanced step-up transformer (unbalanced-to-balanced—Balun) may be used to "float" the node of the capacitor 406 not coupled to the inductor 408 and then the other half of the balanced antenna 410b may be coupled thereto. The circuit shown in FIG. 4 may also be used for a balanced load by placing a Balun (not shown) between the unbalanced output of the (load side of inductor 408) and the balanced load (antenna) 410a, 410b; however, with the Balun placed at the input of the matching network, the Balun is in a controlled impedance node as opposed to the widely variable impedances of the output load.

The impedance matching circuits shown in FIGS. 4 and 5 may comprise a continuously variable inductor 408, e.g., roller inductor, or switched fix value inductors using switching relays (not shown) or manually operated switch contacts (not shown). Similarly, the capacitor 406 may be continuously variable, e.g., air variable, vacuum variable; or switched fix value capacitors using switching relays (not shown) or manually operated switch contacts (not shown).

The impedance matching circuits shown in FIGS. 4A, 4B and 5 may be configured in an enclosure having adjustment knobs and/or switches that may be manually adjusted by a radio operator using a VSWR or reflected power meter. The RF source (transmitter) 402 may be used to provide RF power for adjustment of the inductor 408 and capacitor 406, or an antenna analyzer may be used to supply a frequency and determine when the input to the 1:N step-up impedance transformer is 50 ohms. The inductor 408 and capacitor 406 may also be adjusted by the radio operator by listening to noise or signal strength increase on a radio receiver. The radio operator may adjust the inductor 408 and capacitor 406 for maximum RF power output to the RF load (antenna) 410 by using an in-line RF power meter such as a Bird watt meter. Since there is only one combination of inductor 408 and capacitor 406 settings the radio operator may easily and quickly adjust the impedance matching circuits shown in FIGS. 4A, 4B and 5 for proper impedance matching of the RF load (antenna) 410 to the RF source (transmitter) 402.

The impedance step-up transformer 404, variable capacitor 406 and variable inductor 408 may be built into and be part of a radio transceiver (transmitter and receiver combined). Adjustment of the inductor 408 and capacitor 406 may be performed either manually or automatically.

The impedance matching circuits shown in FIGS. 4A, 4B and 5 may also be configured in a weatherproof enclosure located at or near the RF load (antenna) 410 and the radio operator may remotely control the adjustments for the inductor 408 and capacitor 406. These adjustments may be performed manually as described above or automatically as more fully described hereinafter.

Figure 10:
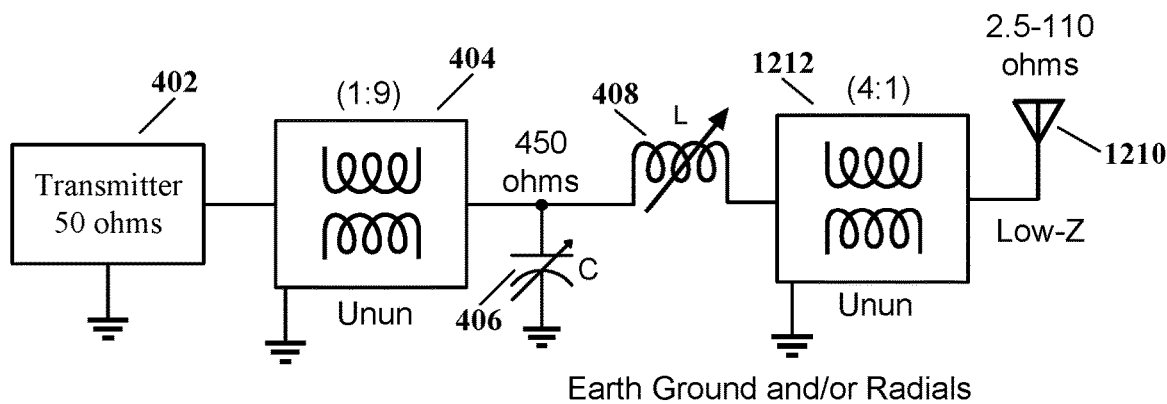
FIG. 10 illustrates a schematic diagram of the antenna coupler shown in FIG. 4 with a four-to-one (4:1) broadband RF transformer between the antenna coupler output and antenna (RF load), according to specific example embodiments of this disclosure.

Referring to FIG. 10, depicted is a schematic diagram of the antenna coupler shown in FIG. 4 with a four-to-one (4:1) broadband RF transformer between the antenna coupler output and antenna (RF load), according to specific example embodiments of this disclosure. A four (4) to one (1) (4:1) impedance step-down transformer 1212 may be coupled between the output end of the inductor 408 and the RF load 1210 to provide a match range of from about 2.5 ohms to about 110 ohms. This step-down transformer 1212 may be switched in and out of the RF path with switches or relays (not shown) controlled by the calculation and selection control circuit 632 (see FIG. 6). The step-down transformer 1212 may also be optionally provided on an as needed basis (internally or externally installed) when the RF load (antenna) 1210 is mainly low impedance at the frequencies of operation. It is contemplated and within the scope of this disclosure that the step-down transformer 1212 may have other step-down impedance ratios, e.g., 2:1, 1.56:1, 1.5:1. The step-down impedance ratios are only limited by the current handling capabilities of the transformer materials. A pair of impedance step-down transformers 1212 or a reverse Balun (unbalanced to balanced transformer) may be used with the impedance matching circuit shown in FIG. 5.

Figure 11:
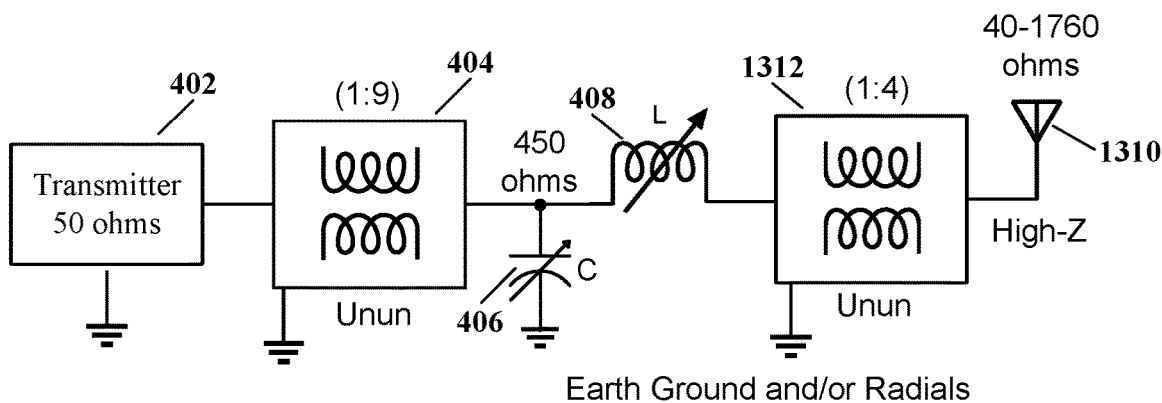
FIG. 11 illustrates a schematic diagram of the antenna coupler shown in FIG. 4 with a one-to-four (1:4) broadband RF transformer between the antenna coupler output and antenna (RF load), according to specific example embodiments of this disclosure.

Referring to FIG. 11, depicted is a schematic diagram of the antenna coupler shown in FIG. 4 with a one-to-four (1:4) broadband RF transformer between the antenna coupler output and antenna (RF load), according to specific example embodiments of this disclosure. A one (1) to four (4)

impedance (1:4) step-up transformer 1312 may be coupled between the output end of the inductor 408 and the RF load 1210 to provide a match range of from about 40 ohms to about 1760 ohms. This step-up transformer 1312 may be switched in and out of the RF path with switches or relays (not shown) controlled by the calculation and selection control circuit 632 (see FIG. 6). The step-up transformer 1312 may also be optionally provided on an as needed basis (internally or externally installed) when the RF load (antenna) 1310 is mainly high impedance at the frequencies of operation. It is contemplated and within the scope of this disclosure that the step-up transformer 1312 may have other step-up impedance ratios, e.g., 1:2, 1:1.56, 1:1.5. The step-up impedance ratios are only limited by the voltage handling capabilities of the step-up transformer materials. A pair of impedance step-up transformers 1312 or a reverse Balun (unbalanced to balanced transformer) may be used with the impedance matching circuit shown in FIG. 5.

Figure 6A:
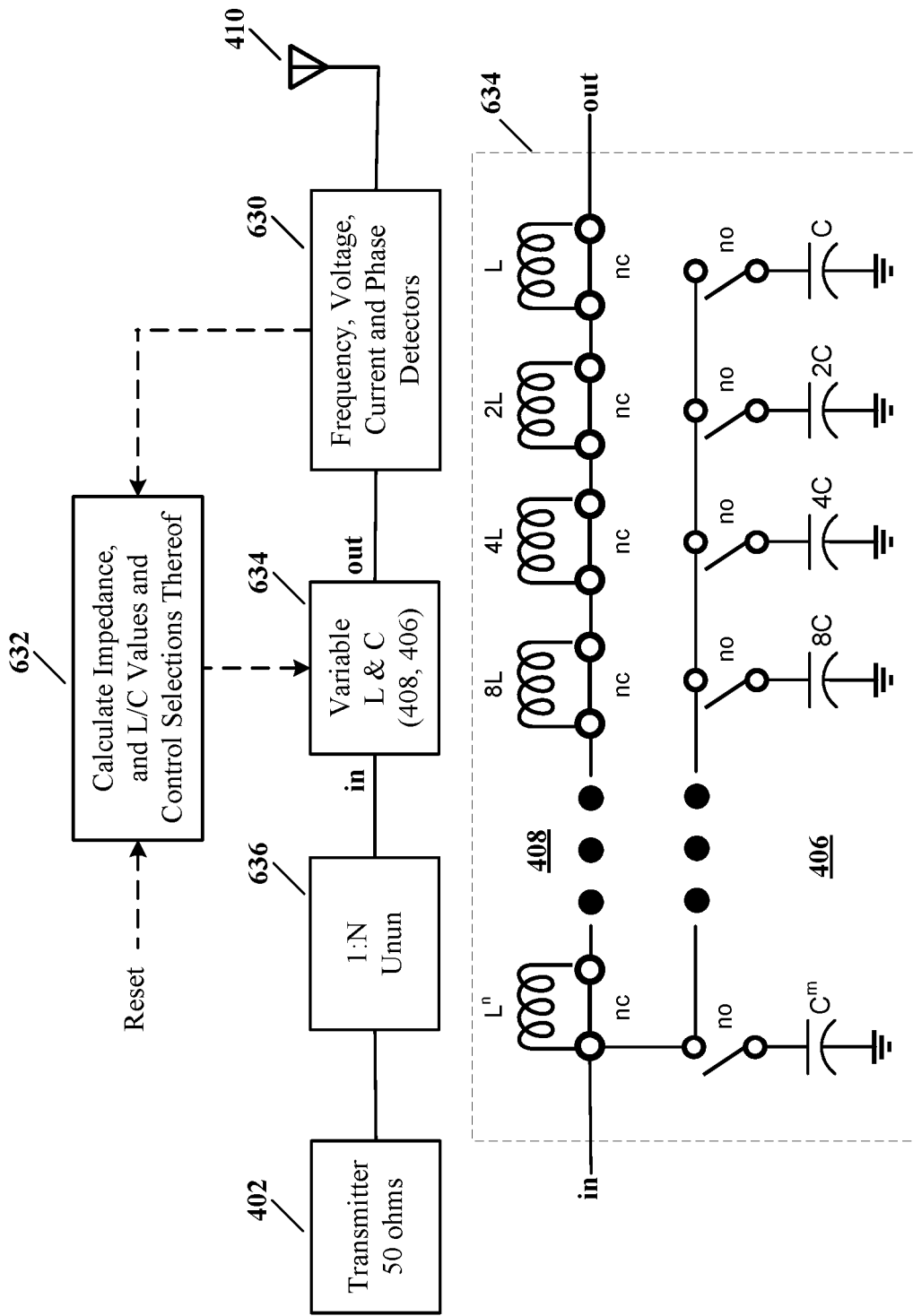
FIGS. 6A-6D illustrate schematic block diagrams of automatic operation antenna couplers, according to specific example embodiments of this disclosure.

Referring to FIG. 6A, depicted is a schematic block diagram of an automatic operation antenna coupler, according to specific example embodiments of this disclosure. The antenna coupler shown in FIG. 6A may comprise a 1:N step-up impedance transformer 636, a matching network 634 comprising configurable values of inductance 408 and capacitance 406, frequency, voltage, current and phase detectors 630, and a calculation and selection control circuit 632.

The output of the (RF source) transmitter 402 may be coupled to the 1:N step-up impedance transformer 636. The matching network 634 may be coupled between the 1:N step-up impedance transformer and the frequency, voltage, current and phase detectors 630. The calculation and selection control circuit 632 may have inputs coupled from the frequency, voltage, current and phase detectors 630 and have outputs coupled to the matching network 634 for controlling selection of inductance and capacitance values of the inductor 408 and capacitor 406 therein. The RF load (antenna) 410 may be coupled to the matching network 634 through the frequency, voltage, current and phase detectors 630.

The calculation and control circuit 632 may comprise a microcontroller having analog-to-digital converters (ADCs) for receiving and converting information from the detectors 630, a frequency counter for determining the signal frequency of the RF source, and outputs for controlling adjustment of the variable inductor 408 and variable capacitor 406 of the matching network 634 (see FIG. 14). A reset signal to the calculation and control circuit 632 may be used to start a new match determination operation once RF power is detected as more fully described hereinafter. The reset may also be used to put the matching network 634 into a "bypass mode" wherein there are no tuned circuits during receiver channel scanning for automatic link establishment (ALE) operation. Wherein the matching network 634 will reactivate connection of the inductor 408 and capacitor 406 when RF power is again applied to the matching network 634.

A more detailed schematic circuit diagram depicts a plurality of inductors 408 and a plurality of capacitors 406 configured as a low pass filter L-network. Each switch (relay) contact associated with the plurality of inductors 408 is normally closed, and each switch (relay) contact associated with the plurality of capacitors 406 is normally open. Thus, when the switches (relays) are not activated (powered) the plurality of inductors are shorted out of the signal path, and the plurality of capacitors are disconnected therefrom. For a matching operation the plurality of inductors and capacitor values may be binary weighted for efficiency in selecting various value combinations thereof. A high pass filter configuration for the matching network 634 may be similarly configured as shown in FIG. 4B.

Figure 6B:
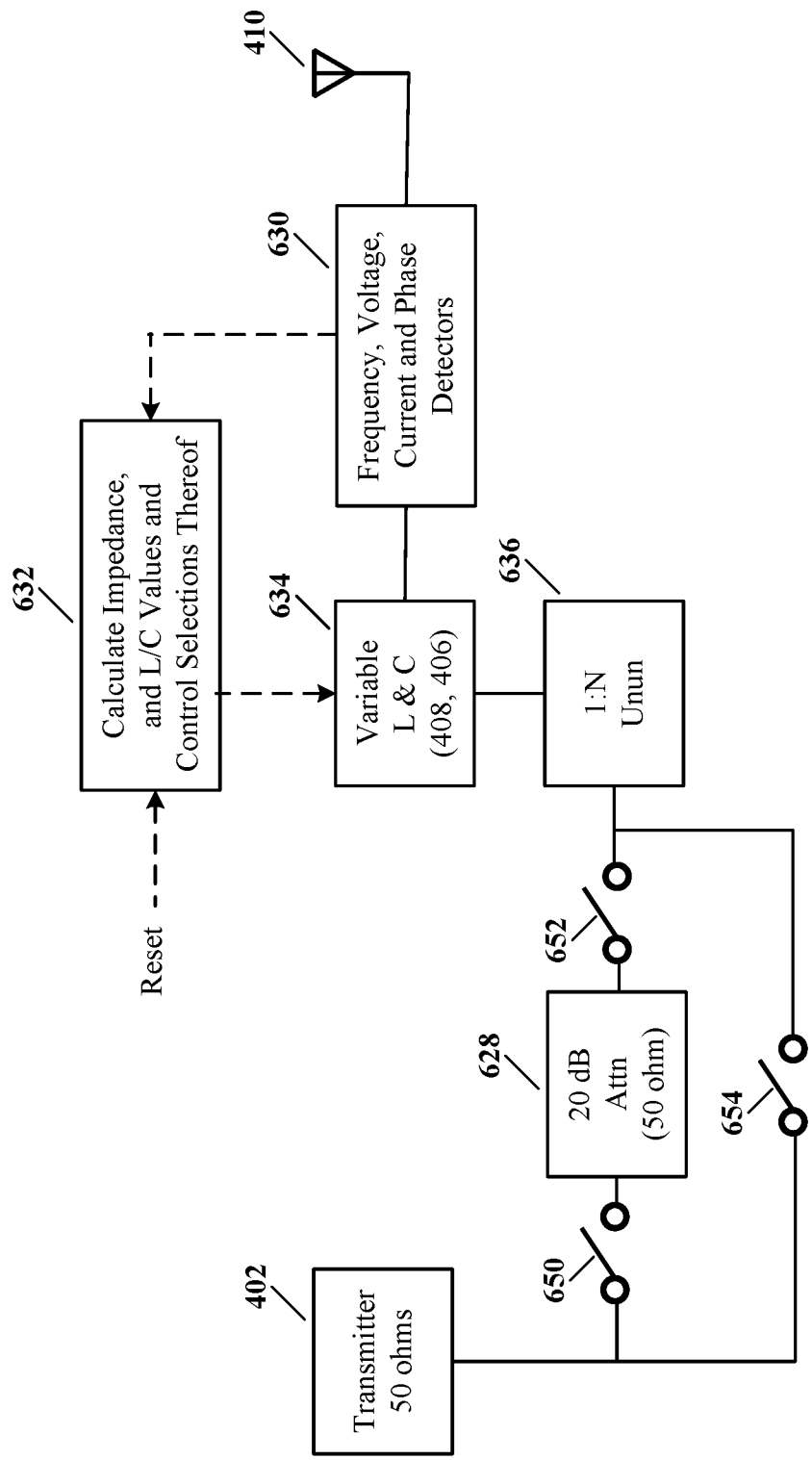

Referring to FIG. 6B, depicted is a schematic block diagram of an automatic operation antenna coupler, according to specific example embodiments of this disclosure. The antenna coupler shown in FIG. 6B is substantially similar in configuration and operation as the antenna coupler of FIG. 6A, and further comprises a RF attenuator 628 and associated switches 650, 652 and 654. The attenuator 628 may be coupled between the transmitter (RF source) 402 and the 1:N step-up impedance transformer 636. The RF attenuator 628 may provide a more uniform impedance load to the transmitter 402 and reduce RF power during configuring the inductors 408 and capacitors 406 for a match. Once the inductors 408 and capacitors 406 have been configured, the RF attenuator 628 may be removed from the RF power path between the transmitter 402 and the antenna 410.

Figure 6C:
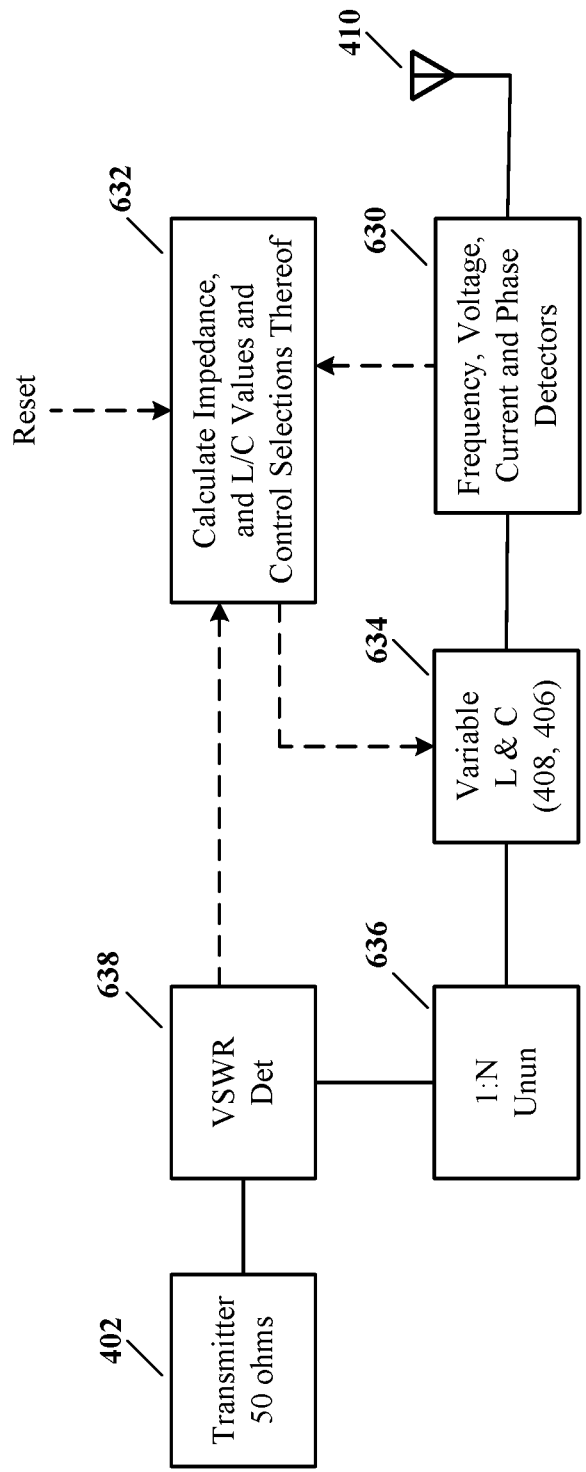

Referring to FIG. 6C, depicted is a schematic block diagram of an automatic operation antenna coupler, according to specific example embodiments of this disclosure. The antenna coupler shown in FIG. 6C is substantially similar in configuration and operation as the antenna coupler of FIG. 6A, and further comprises a voltage standing wave (VSWR) detector 638 coupled between the transmitter 402 and the impedance set-up transformer 636. The VSWR detector 638 may be used to monitor proper operation of the matching network 634, and if a high VSWR is detected then alarm and/or take some action like telling the calculation and control circuit 632 to initiate a new match operation.

Figure 6D:
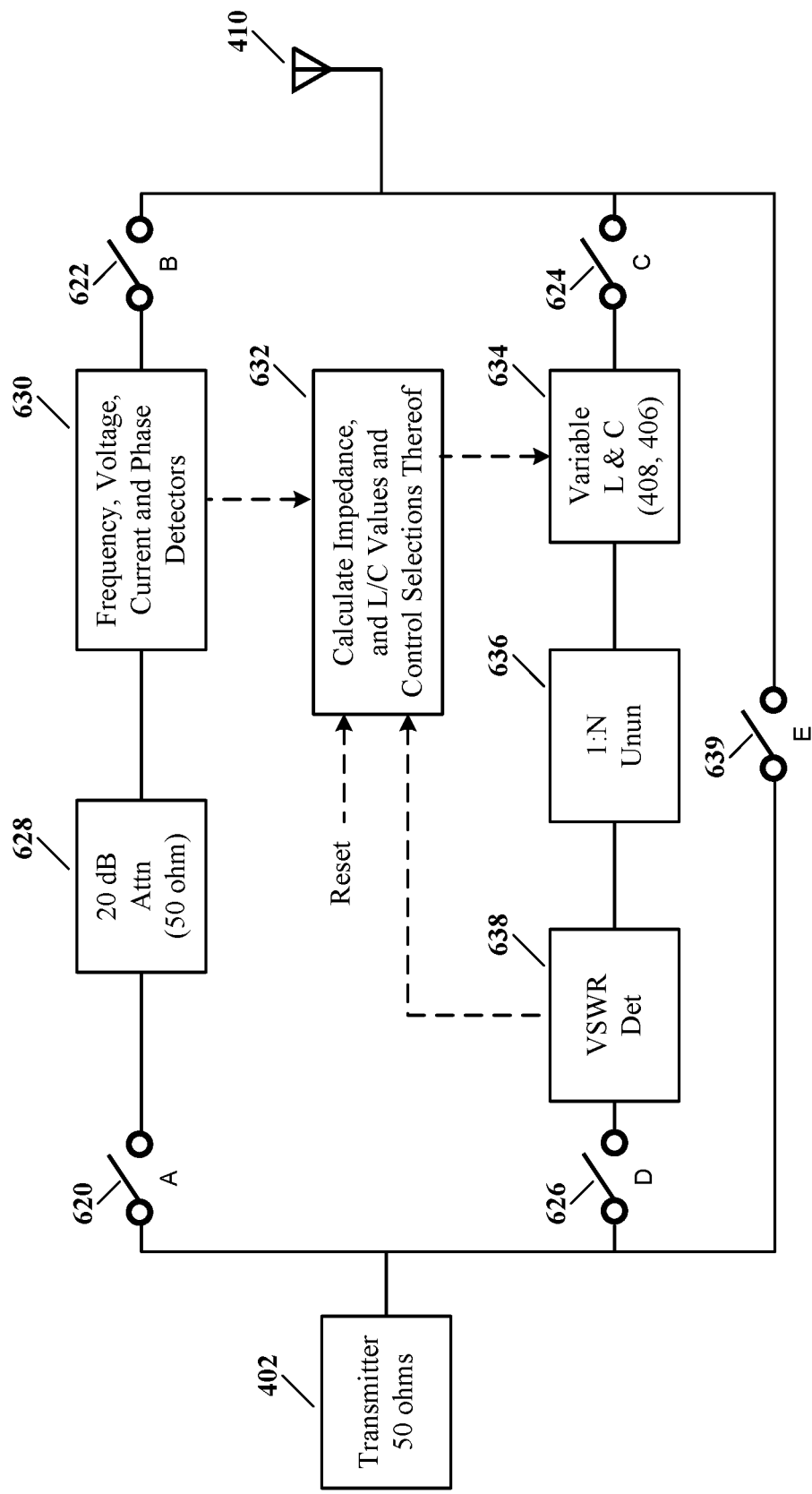

Referring to FIG. 6D, depicted is a schematic block diagram of an automatic operation antenna coupler, according to specific example embodiments of this disclosure. The automatic operation antenna coupler shown in FIG. 6D may comprise a plurality of relays 620-626, a RF attenuator 628, frequency, voltage, current and phase detectors (sensors) 630, an inductor (L) and capacitor (C) value calculation and selection control circuit 632, an L/C matching network 634 comprising configurable values of inductance 408 and capacitance 406, a 1:N step-up impedance transformer 636, and a voltage standing wave ratio (VSWR) detector 638. The output of the (RF source) transmitter 402 may be coupled to the attenuator 628 through switch 620. The output of the attenuator 628 may be coupled to an input of the frequency, voltage, current and phase detectors 630; and the output thereof to the RF load (antenna) 410 through switch 622. Switches 624 and 626 couple the matching network 634, 1:N step-up impedance transformer 636 and a voltage standing wave ratio (VSWR) detector 638 between the transmitter 402 and load 410, as more fully described hereinafter. The calculation and control circuit 632 may comprise a microcontroller having analog-to-digital converters (ADCs) for the receiving and converting information from the detectors (sensors) 630 and VSWR detector 638, counters for determining the frequency of the RF signal, and outputs for controlling adjustment of the variable inductor and capacitor (see FIG. 14).

Figure 7:
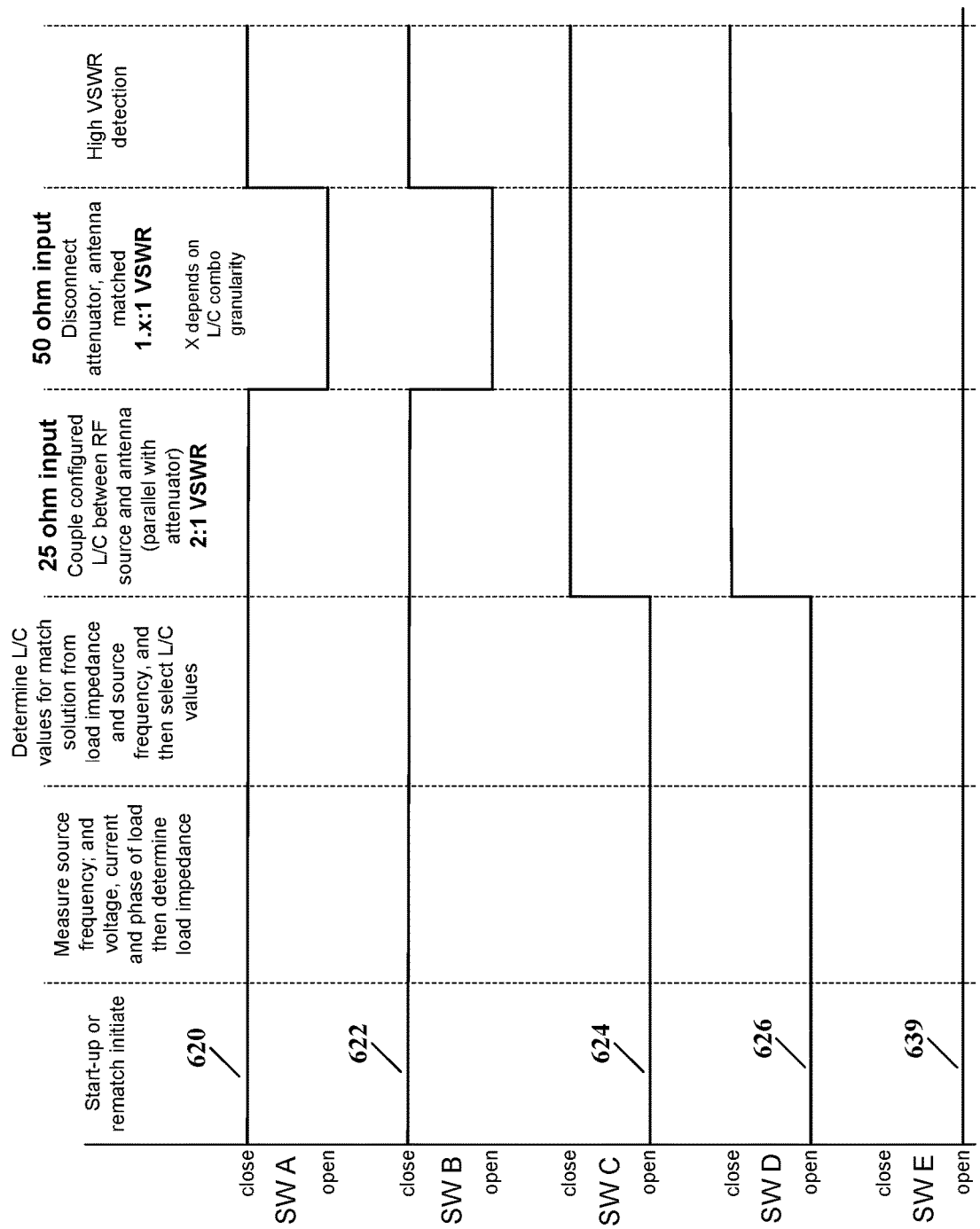
FIG. 7 illustrates a schematic timing diagram of the automatic antenna coupler shown in FIG. 6D, according to specific example embodiments of this disclosure.

Referring to FIG. 7, depicted is a schematic timing diagram of the automatic antenna coupler shown in FIG. 6D, according to specific example embodiments of this disclosure. When switches 620 and 622 are closed the frequency, voltage, current and phase detectors 630 use an attenuated sample from the attenuator 628 of RF power coupled to the (RF load) antenna 410, and thereby measure the voltage, current and phase of the antenna 410 at the frequency of the RF power supplied by the transmitter 402 to the antenna 410. Once the frequency, voltage, current and phase angle between the voltage and current at the antenna 410 have been measured; the inductor 408 and capacitor 406 values may be determined for a match solution.

The calculation and selection control circuit 632 may determine the inductance and capacitance values required for an impedance match condition between the RF source 402 and RF load 410, then may control selection of the appropriate inductance and capacitance values of the matching network 634. During the frequency, voltage, current and phase detection; and inductance and capacitance value selection the relays 624 and 626 are open, whereby no RF power is applied to the matching network 634. This feature greatly improves component reliability and longevity (relay or switch contacts may switch under no, or limited, voltage and current conditions).

Only after the selection of the inductance and capacitance values have been made will the switches 624 and 626 close, and then are subject to only about one-half RF power since the 50 ohm attenuator 628 is still coupled between the RF power source 402 and the (RF load) antenna 410 and in parallel with the matching network 634. An advantage of the aforementioned method of operation is that the RF power source 402 will not see a VSWR of greater than about 2:1 (50-ohm attenuator load in parallel with the now 50-ohm impedance configured L-C network 634 coupled between the transmitter 402 and antenna 410). Once the switches 624 and 626 have closed, switches 620 and 622 can open and the RF power source 402 then sees the RF load 410 as substantially 50 ohms.

The VSWR detector 638 may continuously monitor VSWR of the RF load 410 and if the load VSWR increases above a certain value then the switches 620 and 622 will close again and thereafter the switches 624 and 626 will open. This will provide an automatic rematch initiate and the aforementioned switching sequences, load impedance determination, and L-C selections will be done again.

Bypass switch 639 may be used for automatic link establishment (ALE) operation, wherein the switch 639 bypasses the antenna coupler (switches 620-626 open) and directly couples the RF source 402 (ALE radio transceiver in this case) to the antenna 410 (switch 639 closed) for ALE receive channel scanning. Since match determination (impedance and frequency measurement and inductor and capacitor values selection) is so fast that no match solution memories are required when going back to transmit if a new match solution is required at a different transmit frequency or load impedance, and the antenna coupler is again between the transmitter 402 and antenna 410.

Figure 8A:
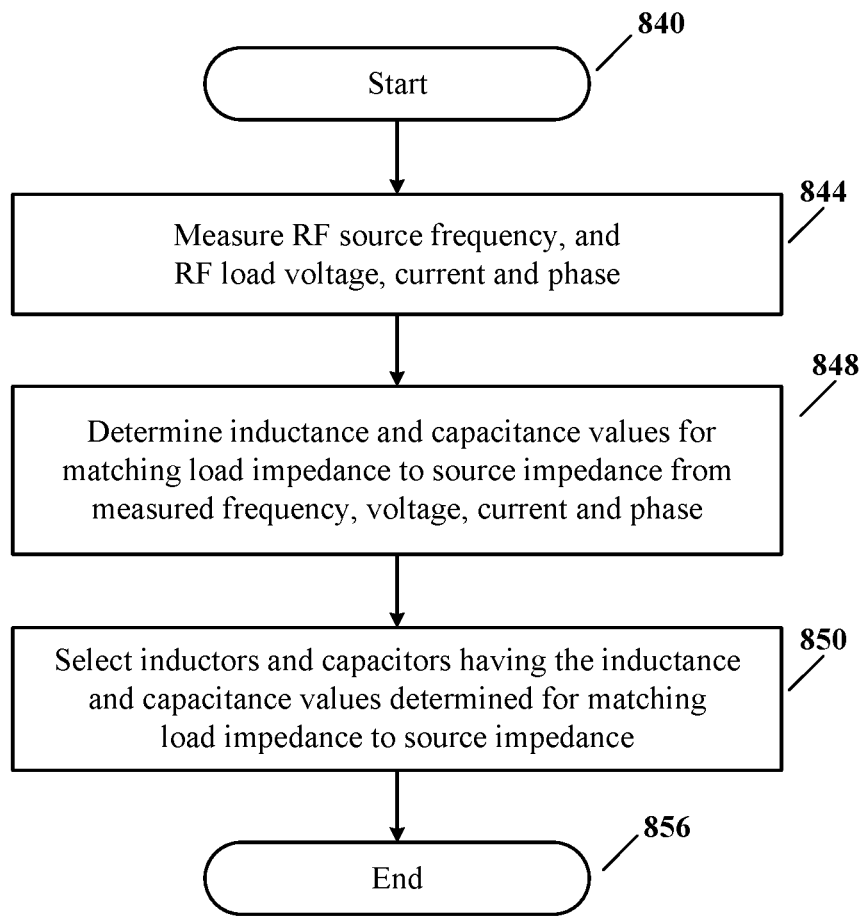
FIGS. 8A, 8B and 8C illustrate schematic operational flow diagrams of the automatic antenna couplers shown in FIGS. 6A, 6B and 6D, respectively, according to specific example embodiments of this disclosure.

Referring to FIG. 8A, depicted is a schematic operational flow diagram of the automatic operation antenna coupler shown in FIG. 6A, according to specific example embodiments of this disclosure. Since the input to the matching network 634 will be at a higher impedance than the impedance of the RF load 410, there will be only one combination of inductance and capacitance values to produce a match. Step 840 starts the match sequence. In step 844 the RF source frequency, and RF load voltage, current and phase are measured. In step 848 the inductor and capacitor values for the matching network 634 are determined (calculated) from the measured RF source frequency, and RF load voltage, current and phase. In step 850 the values for the inductor 408 and the capacitor 406 are selected to provide a match between the RF source 402 and RF load 410. Step 856 ends the match sequence.

Figure 8B:
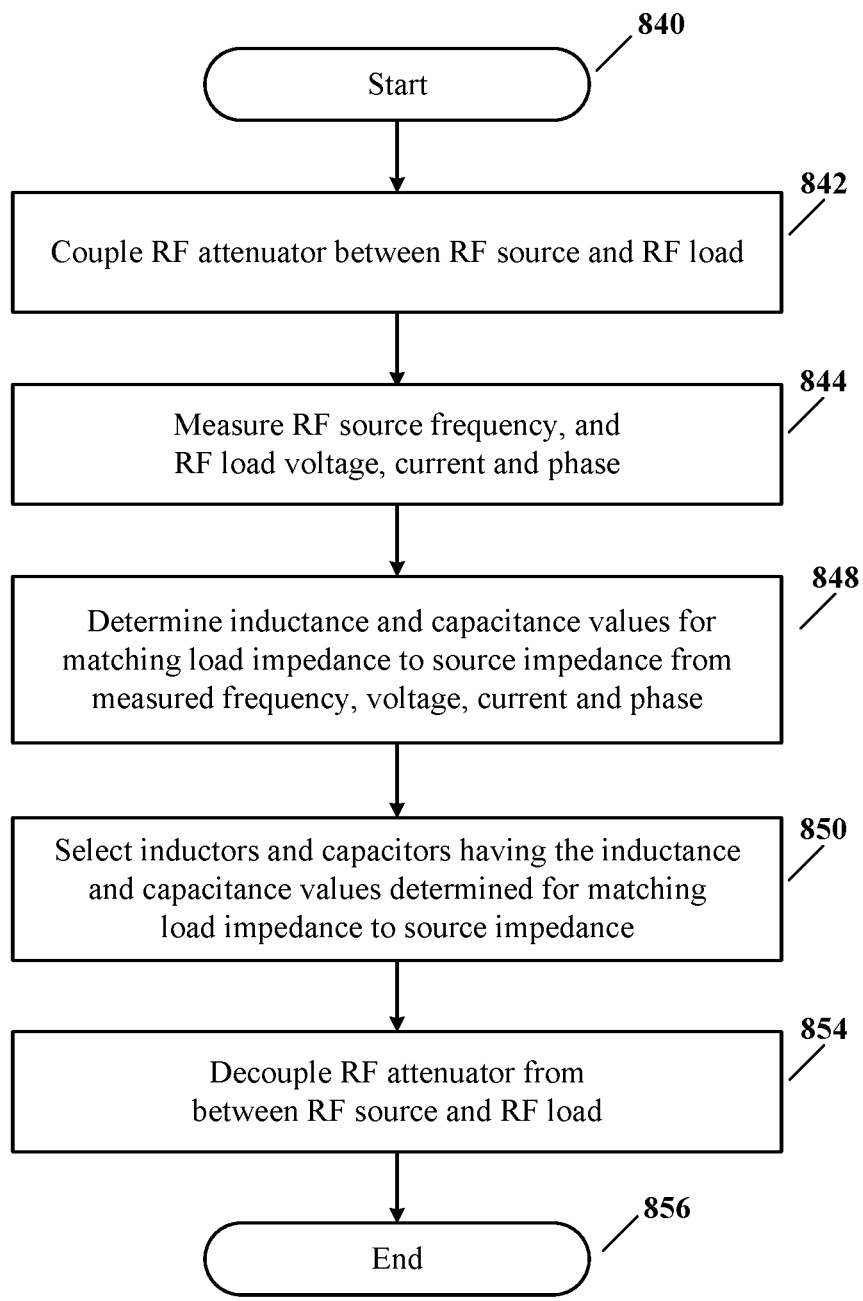

Referring to FIG. 8B, depicted is a schematic operational flow diagram of the automatic operation antenna coupler shown in FIG. 6B, according to specific example embodiments of this disclosure. Since the input to the matching network 634 will be at a higher impedance than the impedance of the RF load 410, there will be only one combination of inductance and capacitance values to produce a match. Step 840 starts the match sequence. In step 842 the RF attenuator 628 is coupled between the transmitter 402 and the 1:N step-up impedance transformer 636 with switches 650 and 652 closed and switch 654 open. In step 844 the RF source frequency, and RF load voltage, current and phase are measured. In step 848 the inductor and capacitor values for the L-C network 634 are determined (calculated) from the measured RF source frequency, and RF load voltage, current and phase. In step 850 the values for the inductor 408 and the capacitor 406 are selected to provide a match between the RF source 402 and RF load 410. In step 854 the RF attenuator 628 is decoupled from the transmitter 402 and the 1:N step-up impedance transformer 636 when switches 650 and 652 open and switch 654 closes. Step 856 ends the match sequence.

Figure 8C:
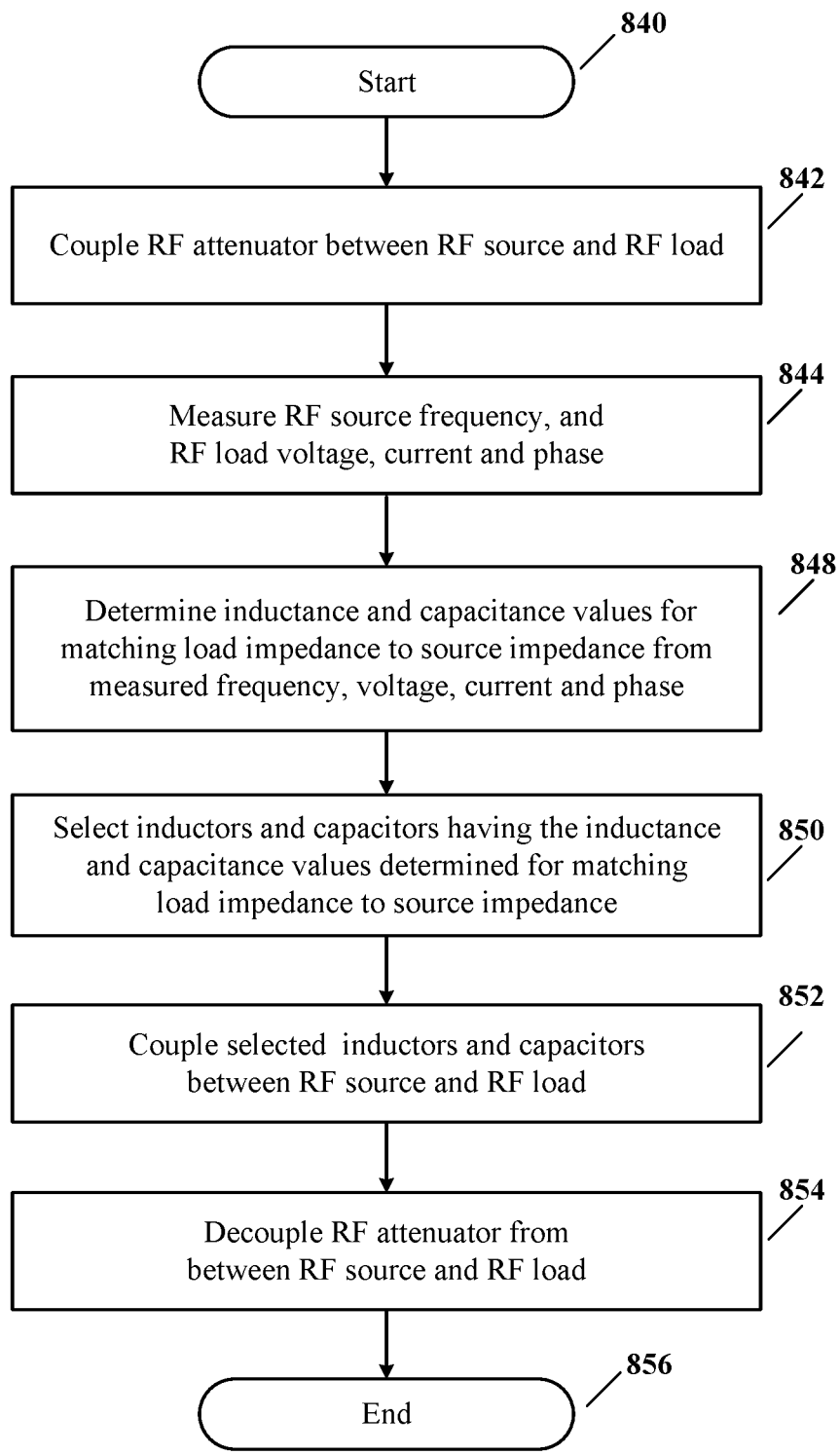

Referring to FIG. 8C, depicted is a schematic operational flow diagram of the automatic operation antenna coupler shown in FIG. 6D, according to specific example embodiments of this disclosure. Since the input to the L-C network 634 will be at a higher impedance than the impedance of the RF load 410, there will be only one combination of inductance and capacitance values to produce a match. Step 840 starts the match sequence. In step 842 the RF attenuator 628 and the frequency, voltage, current and phase detectors 630 are coupled between the RF source 402 and RF load 410. In step 844 the RF source frequency, and RF load voltage, current and phase are measured. In step 848 the inductor and capacitor values for the L-C network 634 are determined (calculated) from the measured RF source frequency, and RF load voltage, current and phase. In step 850 the values for the inductor 408 and the capacitor 406 are selected to provide a match between the RF source 402 and RF load 410. In step 852 the selected inductor(s) 408 and capacitor(s) are coupled between the RF source 402 and RF load 410. In step 854 the RF attenuator 628, and frequency, voltage, current and phase detectors 630 are decoupled from the RF source 402 and RF load 410. Step 856 ends the match sequence.

The required inductance and capacitance values may be determined once the RF source frequency and RF load voltage, current and phase are known. Then appropriate values for of inductance and capacitance may be selected without having to apply RF power during selection thereof. There is no iterative tuning required of the matching circuit 634. All inductor/capacitor selection relay and/or switch contacts may be opened and closed without the possibility of contact arcing and damage therefrom since no, or very little, RF power may be present during any change to the inductance and capacitance values.

Figure 12:
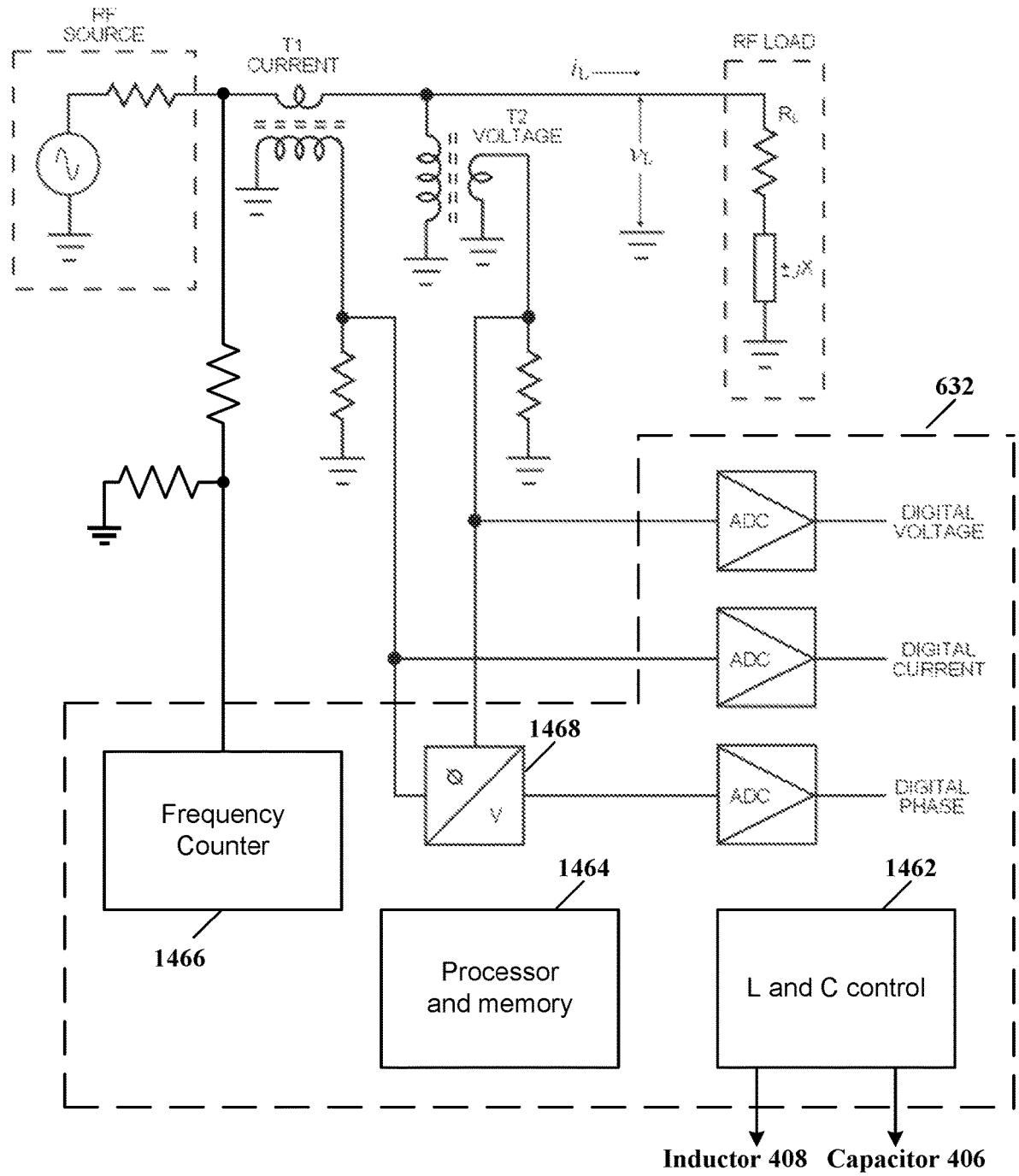
FIG. 12 illustrates a schematic circuit diagram for measuring and processing RF source frequency, RF load voltage, current and phase; and control of the inductor(s) and capacitor(s) for matching the RF load to the RF source, according to specific example embodiments of this disclosure.

Referring to FIG. 12, depicted is a schematic circuit diagram for measuring and processing RF source frequency, RF load voltage, current and phase; and control of the inductor(s) and capacitor(s) for matching the RF load to the RF source, according to specific example embodiments of this disclosure, according to specific example embodiments of this disclosure. A current transformer T1 may be used to measure RF load current. A voltage transformer T2 may be used to measure RF load voltage, and the phase angle between the measured voltage and current may be obtained from a phase-to-voltage converter 1468. The phase-to-voltage converter 1468 may provide a DC voltage having an amplitude proportional to the phase angle difference between the load voltage and load current. The phase-to-voltage converter 1468 output voltage may be configured so that when the load voltage leads the load current (inductive reactance) the converter 1468 output voltage is positive and when the load voltage lags the load current (capacitive reactance) the converter 1468 output voltage is negative or visa-versa.

A microcontroller may be used for the calculation and selection control circuit 632 and may provide all necessary signal processing modules such as analog-to-digital converters (ADC), phase-to-voltage converter 1468, frequency counter 1466, digital outputs to control selection of the capacitors 406 and inductors 408, and a digital processor and memory 1464.

Referring to FIG. 13, depicted are: (a) vector diagram plots of measured voltage and current, and the resultant calculated impedance of the RF load, and (b) example equations to calculate load impedance and convert to equivalent resistance (R) and reactance (X) values, according to the teachings of this disclosure. FIG. 13(*a*) depicts vector plots representing load voltage $V_L$, $V_R$ and $V_X$, and load resistance (R), reactance (jX) and impedance ($Z_L$). FIG. 13(*b*) shows the equations for finding load resistance (R), reactance (jX) and impedance ($Z_L$).

Figure 9:
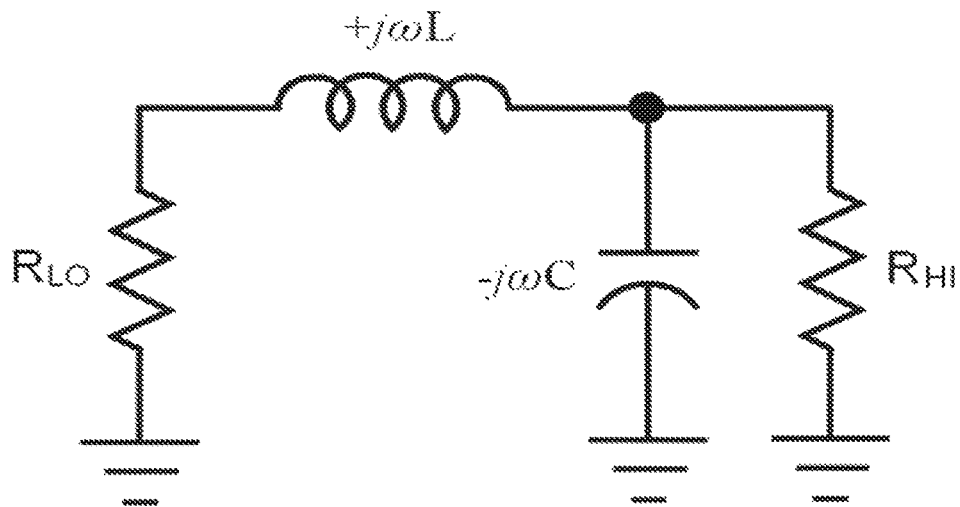
FIG. 9 illustrates a schematic diagram for transforming a low impedance to a high impedance using an inductor and capacitor, and equations for deriving the inductor and capacitor values.

Referring to FIG. 9, depicted is a schematic diagram for transforming a low impedance to a high impedance using an inductor and capacitor, and equations for deriving the inductor and capacitor values. Using the equations of FIG. 13, the resistive and reactive values of the load may be calculated, then the L-Match equations shown in FIG. 9 may be used to determine the proper values of capacitance and inductance to provide a match. The last step is to add or subtract the reactive part of load 410 to the value of inductance required. In the example shown, the load has 10-ohm inductive reactance. This will then be subtracted from the match inductance to provide an overall inductance required to match the resistive part of the load 410.

The present disclosure has been described in terms of one or more embodiments, and it should be appreciated that many equivalents, alternatives, variations, and modifications, aside from those expressly stated, are possible and within the scope of the disclosure. While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein.

What is claimed:

1. A method for matching an impedance of a radio frequency (RF) load to an impedance of a RF source, said method comprising the steps of:
    a) providing a matching network comprising a variable capacitor and a variable inductor;
    b) providing a 1:N step-up impedance transformer having an output coupled to the matching network;
    c) coupling a RF attenuator; and frequency, voltage, current and phase detectors between an RF source and an RF load;
    d) measuring the RF source frequency, and the RF load voltage, current and phase;
    e) determining inductance and capacitance values of the matching network required to match the RF load impedance to the RF source impedance using the measured frequency, voltage, current and phase;
    f) setting the variable inductor to the determined inductance value and the variable capacitor to the determined capacitance value;
    g) coupling the RF source to the input of the 1:N step-up impedance transformer and the RF load to the matching network, wherein the RF source has a first impedance that is stepped up to a second impedance at the output of the 1:N step-up impedance transformer, the second impedance is N times the first impedance, and the second impedance is greater than the RF load impedance; and
    h) decoupling the RF attenuator previously coupled between the RF source and the RF load.

2. The method according to claim 1, further comprising the step of decoupling the frequency, voltage, current and phase detectors previously coupled between the RF source and the RF load when the RF attenuator is decoupled in step h).

3. The method according to claim 1, wherein N is 9, the first impedance is 50 ohms and the second impedance is 450 ohms.

4. The method according to claim 1, wherein N is selected from the group consisting of 4, 9 and 12.

5. The method according to claim 1, wherein the RF source is a RF transmitter and the RF load is an antenna.

6. The method according to claim 1, wherein the matching network is configured as a low pass filter whereby the variable capacitor is coupled at the output of the 1:N step-up impedance transformer and the variable inductor is coupled between the output of the 1:N step-up impedance transformer and the RF load.

7. The method according to claim 1, wherein the matching network is configured as a high pass filter whereby the variable inductor is coupled at the output of the 1:N step-up impedance transformer and the variable capacitor is coupled between the output of the 1:N step-up impedance transformer and the RF load.

8. The method according to claim 1, further comprising the steps of: monitoring the voltage standing wave ratio (VSWR) at the RF source and if the VSWR exceeds a certain value then go to step a) and thereafter decouple the 1:N step-up transformer, variable inductor and capacitor of steps e) through g) and repeat steps b) through h).

9. The method according to claim 8, wherein the certain value is 2:1.

10. The method according to claim 1, wherein the variable inductor comprises a roller inductor.

11. The method according to claim 1, wherein the variable inductor comprises a plurality of inductors having an inductance configured with a first plurality of switches that short out unused ones of the plurality of inductors, and the variable capacitor comprises a plurality of capacitors having a capacitance configured with a second plurality of switches that disconnect unused ones of the plurality of capacitors.

12. The method according to claim 11, wherein the plurality of first and second switches are a plurality of first and second relay contacts.

13. The method according to claim 11, wherein the plurality of first and second switches are a plurality of first and second solid-state switches.

14. The method according to claim 13, wherein the first and second solid-state switches are PIN diode switches.

15. The method according to claim 1, further comprising the step of increasing the RF load impedance with a step-up impedance transformer coupled between the RF load and the matching network.

16. The method according to claim 1, further comprising the step of decreasing the RF load impedance with a step-down impedance transformer coupled between the RF load and the matching network.

* * * * *